(12) United States Patent
Takahashi et al.

(10) Patent No.: US 9,961,775 B2
(45) Date of Patent: May 1, 2018

(54) BUILT-IN-ELECTRONIC-COMPONENT SUBSTRATE AND MANUFACTURING METHOD THEREFOR

(71) Applicant: Murata Manufacturing Co., Ltd., Nagaokakyo-shi, Kyoto-fu (JP)

(72) Inventors: Masaru Takahashi, Nagaokakyo (JP); Choichiro Fujii, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 19 days.

(21) Appl. No.: 14/928,136

(22) Filed: Oct. 30, 2015

(65) Prior Publication Data

US 2016/0128199 A1 May 5, 2016

(30) Foreign Application Priority Data

Nov. 5, 2014 (JP) .................................. 2014-225141

(51) Int. Cl.
*H01G 4/30* (2006.01)
*H05K 1/18* (2006.01)
*H05K 3/30* (2006.01)
*H01G 4/06* (2006.01)
*H01G 4/228* (2006.01)
(Continued)

(52) U.S. Cl.
CPC .............. *H05K 1/185* (2013.01); *H01G 4/30* (2013.01); *H05K 1/0271* (2013.01); *H05K 3/3442* (2013.01); *H05K 2201/10015* (2013.01); *H05K 2201/10636* (2013.01); *H05K 2203/122* (2013.01); *Y02P 70/611* (2015.11)

(58) Field of Classification Search
CPC .................................. H01G 4/30; H05K 1/185

USPC ............. 361/321.1, 303, 301.4, 321.2, 306.3
See application file for complete search history.

(56) References Cited

U.S. PATENT DOCUMENTS 6,139,944 A 10/2000 Moriyasu et al.
2003/0122638 A1 7/2003 Tarui et al.
(Continued)

FOREIGN PATENT DOCUMENTS

CN 103390498 A 11/2013
JP 58-182811 A 10/1983
(Continued)

OTHER PUBLICATIONS

Official Communication issued in corresponding Japanese Patent Application No. 2014-225141, dated Mar. 21, 2017.

*Primary Examiner* — Eric Thomas
*Assistant Examiner* — Arun Ramaswamy
(74) *Attorney, Agent, or Firm* — Keating & Bennett, LLP

(57) ABSTRACT

A built-in-electronic-component substrate includes a core substrate, an electronic component mounted on one main surface of the core substrate via a joining member, and a resin layer including the electronic component embedded therein. The electronic component is a multilayer ceramic capacitor including a ceramic multilayer body, and a first outer electrode including an end surface portion and a second outer electrode including an end surface portion provided on end surfaces of the ceramic multilayer body. A first gap is provided between the resin layer and the end surface portion of the first outer electrode and the joining member and a second gap is provided between the resin layer and the end surface portion of the second outer electrode and the joining member.

13 Claims, 18 Drawing Sheets

(51) Int. Cl.
*H01G 4/005* (2006.01)
*H05K 1/02* (2006.01)
*H05K 3/34* (2006.01)

(56) References Cited

U.S. PATENT DOCUMENTS

| | | |
|---|---|---|
| 2013/0050957 A1 | 2/2013 | Ogawa et al. |
| 2013/0299215 A1 | 11/2013 | Taseda et al. |
| 2013/0319741 A1* | 12/2013 | Ahn .................... H01G 4/30 174/260 |
| 2013/0329389 A1* | 12/2013 | Hattori ................ H05K 1/0216 361/782 |

FOREIGN PATENT DOCUMENTS

| | | |
|---|---|---|
| JP | 11-135688 A | 5/1999 |
| JP | 2003-197863 A | 7/2003 |
| JP | 2006-041071 A | 2/2006 |
| JP | 2011-009482 A | 1/2011 |
| WO | 2011/135926 A1 | 11/2011 |

\* cited by examiner

BUILT-IN-ELECTRONIC-COMPONENT SUBSTRATE AND MANUFACTURING METHOD THEREFOR

BACKGROUND OF THE INVENTION

1. Field of the Invention

The present invention relates to a built-in-electronic-component substrate, which includes a core substrate, an electronic component mounted on one main surface of the core substrate and a resin layer provided such that the electronic component is embedded therein, and relates to a manufacturing method for the built-in-electronic-component substrate.

2. Description of the Related Art

In recent years, with continuing reduction in the thickness of mobile electronic appliances, built-in-electronic-component substrates, which have a reduced substrate thickness due to electronic components being embedded inside the substrates, have been proposed, as seen in International Publication No. 2011/135926, for example.

FIG. 17 is a sectional view of a built-in-electronic-component substrate 100 described in International Publication No. 2011/135926. In the built-in-electronic-component substrate 100 illustrated in FIG. 17, electronic components 101 and 102 are mounted on a core substrate 108 and a resin layer 109 is formed such that the electronic components 101 and 102 are embedded thereinside.

The built-in-electronic-component substrate 100 is light-weight and has an advantage in that there are few restrictions on the electronic components that may be built thereinto since it is not subjected to high-temperature firing as with ceramic substrates.

Here, multilayer ceramic capacitors are considered as the electronic components 101 and 102 embedded in the resin layer 109 of the built-in-electronic-component substrate 100 described in International Publication No. 2011/135926. FIG. 18 illustrates a sectional view of a multilayer ceramic capacitor 201.

The multilayer ceramic capacitor 201 includes a ceramic multilayer body 202 and a first outer electrode 203 and a second outer electrode 204 provided on a surface of the ceramic multilayer body 202. The ceramic multilayer body 202 is formed by stacking and connecting in parallel or substantially parallel with each other capacitor elements in each of which a ceramic dielectric layer 205 is interposed between a first inner electrode 206 and a second inner electrode 207. Such a multilayer ceramic capacitor 201 is excellent in terms of reliability and durability and can realize a large capacitance despite being small in size.

A high-dielectric-constant ceramic material having barium titanate as a base material is often used as the material of the ceramic dielectric layers 205 of the ceramic multilayer body 202 in the small-size large-capacitance multilayer ceramic capacitor 201. When a voltage is applied to the multilayer ceramic capacitor 201 including the ceramic multilayer body 202, a strain is generated in the ceramic multilayer body 202 in accordance with the size of the applied voltage due to the electrostrictive effect and the inverse piezoelectric effect. As a result, the ceramic multilayer body 202 repeatedly undergoes expansion in a stacking direction of the ceramic multilayer body 202 and contraction in a planar direction perpendicular or substantially perpendicular to the stacking direction.

In recent years, with the progress made in reducing the size and thickness of the multilayer ceramic capacitor 201, the intensity of the electric fields applied to the dielectric layers has increased and therefore the size of the strain acting in the ceramic multilayer body 202 has also increased.

Here, a case in which the multilayer ceramic capacitor 201 is mounted on a substrate B using joining members S such as solder as illustrated in FIG. 19A will be considered. When a voltage is applied to the multilayer ceramic capacitor 201, as illustrated in FIG. 19B, a strain generated in the ceramic multilayer body 202 causes the substrate B, which is fixed to the multilayer ceramic capacitor 201 by the joining members S, to vibrate.

If an acceleration sensor such as a shock sensor were mounted on the substrate B, it is possible that this vibration of the substrate B would cause erroneous operation of the acceleration sensor.

In addition, if the frequency of this vibration is within the range of 20 Hz to 20 kHz, which the frequency range of audible sound, the vibration would be perceived by the human ear as an audible sound. This phenomenon is called acoustic noise and is an issue in making electronic appliances quiet and in the design of power supply circuits of various applications such as laptop computers, cellular phones and digital cameras.

When the multilayer ceramic capacitor 201 is mounted on the substrate B using the joining members S as described above and is further embedded in a resin layer as described in International Publication No. 2011/135926, it is thought that the strain generated in the ceramic multilayer body 202 will be transmitted to the substrate B and to the joining members S and the resin layer. In such a case, there is a fear that the above-described vibration of the substrate B will become larger and that the audible sound will become louder.

SUMMARY OF THE INVENTION

Accordingly, preferred embodiments of the present invention provide a built-in-electronic-component substrate for which vibration is reduced and generation of an audible sound due to the vibration is significantly reduced or prevented even when strain is generated due to application of a voltage to an electronic component embedded in a resin layer of the built-in-electronic-component substrate, and provide a manufacturing method for the built-in-electronic-component substrate.

In various preferred embodiments of the present invention, the structure and configuration of a resin layer is improved such that even if strain is generated due to application of a voltage to an electronic component embedded in the resin layer, vibration of the built-in-electronic-component substrate is significantly reduced and in addition generation of an audible sound due to the vibration is significantly reduced or prevented.

One of various preferred embodiments of the present invention is directed to a built-in-electronic-component substrate.

A built-in-electronic-component substrate according to a preferred embodiment of the present invention includes a core substrate, at least one electronic component mounted on one main surface of the core substrate and a resin layer provided on the one main surface of the core substrate such that the electronic component is embedded thereinside.

The electronic component is a multilayer capacitor including a multilayer body, a first outer electrode and a second outer electrode.

The multilayer body includes an electrostatic capacitance exhibiting portion in which capacitor elements, in each of which a dielectric layer is interposed between a first inner electrode and a second inner electrode, are stacked, and includes a first protective portion and a second protective portion sandwiching the electrostatic capacitance exhibiting portion therebetween. In addition, the multilayer body includes two opposing end surfaces that are parallel or substantially parallel to a stacking direction of the capacitor elements and side surfaces that connect the two end surfaces to each other.

The first outer electrode and the second outer electrode each include an end surface portion provided on the corresponding end surface of the multilayer body and are respectively connected to the first inner electrodes and the second inner electrodes at these end surface portions.

A first gap is provided between the resin layer and the end surface portion of the first outer electrode and a joining member on the end surface portion thereof and a second gap is provided between the resin layer and the end surface portion of the second outer electrode and a joining member on the end surface portion thereof.

In the built-in-electronic-component substrate, since the first gap and the second gap are provided, even when strain is generated due to application of a voltage to the electronic component, strain in the vicinities of end surfaces of the electronic component is not transmitted to the resin layer.

Therefore, the transmission of strain in the vicinities of end surfaces of the electronic component to the core substrate via the resin layer is blocked and therefore vibration of the built-in-electronic-component substrate is reduced and generation of an audible sound due to the vibration is significantly reduced or prevented.

In a built-in-electronic-component substrate according to a preferred embodiment of the present invention, it is preferable that a first insertion member having a lower elasticity than the resin layer be provided in the first gap and a second insertion member having a lower elasticity than the resin layer be provided in the second gap.

In this built-in-electronic-component substrate, even when strain is generated due to application of a voltage to the electronic component, strain in the vicinities of the end surfaces of the electronic component is alleviated by the first insertion member and the second insertion member, which have a low elasticity and deform easily.

Therefore, the transmission of strain from the electronic component to the core substrate via the resin layer is significantly reduced or prevented, and vibration of the built-in-electronic-component substrate is significantly reduced and generation of audible sound due to the vibration is significantly reduced or prevented.

In addition, by providing the first insertion member in the first gap and the second insertion member in the second gap, the resin layer in which gaps or hollows are provided are is closer to being a resin layer in which gaps are not provided. Therefore, moisture resistance and the rigidity of the built-in-electronic-component substrate are improved compared to those in the case where only the first gap and the second gap are provided.

In a built-in-electronic-component substrate according to a preferred embodiment of the present invention, it is preferable that a third gap be additionally provided between the resin layer and a portion of the multilayer body not covered by the first outer electrode and the second outer electrode.

In this built-in-electronic-component substrate, since the third gap is provided in addition to the first gap and the second gap, even when strain is generated due to application of a voltage to the electronic component, strain in the vicinities of end surfaces and in the vicinities of side surfaces of the electronic component is not transmitted to the resin layer.

Therefore, transmission of strain from the electronic component to the core substrate via the resin layer is further blocked and as a result vibration of the built-in-electronic-component substrate is further reduced and generation of audible sound due to the vibration is effectively reduced or prevented.

In a built-in-electronic-component substrate according to a preferred embodiment of the present invention, it is preferable that a third insertion member having a lower elasticity than the resin layer be provided in the third gap.

In this built-in-electronic-component substrate, even when strain is generated due to application of a voltage to the electronic component, strain in the vicinities of the end surfaces and in the vicinities of the side surfaces of the electronic component is alleviated by the first, second and third insertion members, which have a low elasticity and deform easily.

Therefore, transmission of strain from the electronic component to the core substrate via the resin layer is further suppressed and as a result, vibration of the built-in-electronic-component substrate is further reduced and generation of audible sound due to the vibration is significantly reduced or prevented.

In addition, by providing the third insertion member in the third gap similarly to as with the first insertion member and the second insertion member described above, the resin layer in which gaps or hollows are provided is closer to being a resin layer in which gaps are not provided. Therefore, moisture resistance and the rigidity of the built-in-electronic-component substrate are improved compared to those in a case where only the third gap is provided.

In addition, a preferred embodiment of the present invention is directed to a manufacturing method for a built-in-electronic-component substrate.

A manufacturing method for a built-in-electronic-component substrate according to a preferred embodiment of the present invention is for manufacturing a built-in-electronic-component substrate including a core substrate, at least one electronic component mounted on one main surface of the core substrate and a resin layer provided on the one main surface of the core substrate such that the electronic component is embedded thereinside.

The electronic component is a multilayer capacitor including a multilayer body, a first outer electrode and a second outer electrode.

The multilayer body includes an electrostatic capacitance exhibiting portion in which capacitor elements, in each of which a dielectric layer is interposed between a first inner electrode and a second inner electrode, are stacked, and includes a first protective portion and a second protective portion sandwiching the electrostatic capacitance exhibiting portion therebetween. In addition, the multilayer body includes two opposing end surfaces that are parallel or substantially parallel to a stacking direction of the capacitor elements and side surfaces that connect the two end surfaces to each other.

The first outer electrode and the second outer electrode each include an end surface portion provided on the corresponding end surface of the multilayer body and are respectively connected to the first inner electrodes and the second inner electrodes at these end surface portions.

A manufacturing method for a built-in-electronic-component substrate according to a preferred embodiment of the present invention includes a mounting step, a step of providing gap forming members, a step of providing an uncured resin layer and a step of forming a resin layer.

The mounting step is a step in which the electronic component is mounted on the one main surface of the core substrate.

The step of providing gap forming members is a step in which a first gap forming member, which is to be removed by heating, is provided on the end surface portion of the first outer electrode of the electronic component mounted on the core substrate and on the joining member on the end surface portion thereof and in which a second gap forming member, which is to be removed by heating, is provided on the end surface portion of the second outer electrode and on the joining member on the end surface portion thereof.

The step of providing an uncured resin layer is a step in which an uncured resin layer is provided on the one main surface of the core substrate such that the electronic component, the first gap forming member and the second gap forming member are embedded thereinside.

The step of forming a resin layer is a step in which the uncured resin layer is thermally cured and the first gap forming member and the second gap forming member are removed by being heated and as a result a first gap is formed between the resin layer and the end surface portion of the first outer electrode and the joining member on the end surface portion thereof and a second gap is formed between the resin layer and the end surface portion of the second outer electrode and the joining member on the end surface portion thereof.

As a result of the manufacturing method for a built-in-electronic-component substrate including these steps, a built-in-electronic-component substrate is effectively manufactured in which vibration of the built-in-electronic-component substrate is reduced and generation of an audible sound due to the vibration is significantly reduced or prevented.

In a manufacturing method for a built-in-electronic-component substrate according to a preferred embodiment of the present invention, it is preferable that the step of providing gap forming members be a step in which, in addition to providing the first gap forming member and the second gap forming member, a third gap forming member is provided on a portion of the multilayer body not covered by the first outer electrode and the second outer electrode.

In addition, it is preferable that the step of providing an uncured resin layer be a step in which an uncured resin layer is provided on the one main surface of the core substrate such that the third gap forming member is embedded thereinside in addition to the electronic component, the first gap forming member and the second gap forming member.

In addition, it is preferable that the step of forming a resin layer be a step in which in addition to thermally curing the uncured resin layer and forming the first gap and the second gap, the third gap forming member is removed by being heated and a third gap is formed between the resin layer and a portion of the multilayer body not covered by the first outer electrode and the second outer electrode.

As a result of the manufacturing method for a built-in-electronic-component substrate including these steps, a built-in-electronic-component substrate is effectively manufactured in which vibration of the built-in-electronic-component substrate is further reduced and generation of an audible sound due to the vibration is effectively significantly reduced or prevented.

A manufacturing method for a built-in-electronic-component substrate according to another preferred embodiment of the present invention is for manufacturing a built-in-electronic-component substrate including a core substrate, at least one electronic component mounted on one main surface of the core substrate and a resin layer provided on the one main surface of the core substrate such that the electronic component is embedded thereinside.

The electronic component is a multilayer capacitor including a multilayer body, a first outer electrode and a second outer electrode as described above.

The multilayer body includes an electrostatic capacitance exhibiting portion in which capacitor elements, in each of which a dielectric layer is interposed between a first inner electrode and a second inner electrode, are stacked, and includes a first protective portion and a second protective portion sandwiching the electrostatic capacitance exhibiting portion therebetween. In addition, the multilayer body includes two opposing end surfaces that are parallel or substantially parallel to a stacking direction of the capacitor elements and side surfaces that connect the two end surfaces to each other.

The first outer electrode and the second outer electrode each include an end surface portion provided on the corresponding end surface of the multilayer body and are respectively connected to the first inner electrodes and the second inner electrodes at these end surface portions.

A manufacturing method for a built-in-electronic-component substrate according to another preferred embodiment of the present invention includes a mounting step, a step of providing insertion members, a step of providing an uncured resin layer and a step of forming a resin layer.

The mounting step is a step in which the electronic component is mounted on the one main surface of the core substrate.

The step of providing insertion members is a step in which a first insertion member is provided on the end surface portion of the first outer electrode of the electronic component mounted on the core substrate and on the joining member on the end surface portion thereof and in which a second insertion member is provided on the end surface portion of the second outer electrode and on the joining member on the end surface portion thereof.

The step of providing an uncured resin layer is a step in which an uncured resin layer is provided on the one main surface of the core substrate such that the electronic component, the first insertion member and the second insertion member are embedded thereinside.

The step of forming a resin layer is a step in which the uncured resin layer is thermally cured.

As a result of the manufacturing method for a built-in-electronic-component substrate including these steps, a built-in-electronic-component substrate is effectively manufactured in which vibration of the built-in-electronic-component substrate is reduced and thus generation of an audible sound due to the vibration is significantly reduced or prevented, and in addition moisture resistance and rigidity of the built-in-electronic-component substrate are improved.

In a manufacturing method for a built-in-electronic-component substrate according to another preferred embodiment of the present invention, it is preferable that the step of providing insertion members be a step in which, in addition to providing the first insertion member and the second insertion member, a third insertion member is provided on a portion of the multilayer body not covered by the first outer electrode and the second outer electrode.

In addition, it is preferable that the step of providing an uncured resin layer be a step in which an uncured resin layer is provided on the one main surface of the core substrate such that the third insertion member is embedded thereinside in addition to the electronic component, the first insertion member and the second insertion member.

As a result of the manufacturing method for a built-in-electronic-component substrate including these steps, a built-in-electronic-component substrate is effectively manufactured in which vibration of the built-in-electronic-component substrate is further reduced and thus generation of an audible sound due to the vibration is effectively significantly reduced or prevented, and in addition moisture resistance and rigidity of the built-in-electronic-component substrate are improved.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 2A is a sectional view taken in the direction of arrows of a plane including the line Y1-Y1 in FIG. 1, and FIG. 2B is a sectional view taken in the direction of arrows of a plane including the line X1-X1 in FIG. 1.

FIG. 12A is a sectional view taken in the direction of arrows of a plane including the line Y5-Y5 in FIG. 11, and FIG. 12B is a sectional view taken in the direction of arrows of a plane including the line X5-X5 in FIG. 11.

FIG. 19A illustrates a state in which a voltage is not being applied and FIG. 19B is a schematic sectional view for explaining a state of strain when a voltage is applied.

DETAILED DESCRIPTION OF THE PREFERRED EMBODIMENTS

Hereafter, various preferred embodiments of the present invention will be described in more detail.

First Preferred Embodiment

A built-in-electronic-component substrate 1 according to a first preferred embodiment of the present invention will be described using FIG. 1 and FIGS. 2A and 2B.

Figure 1:
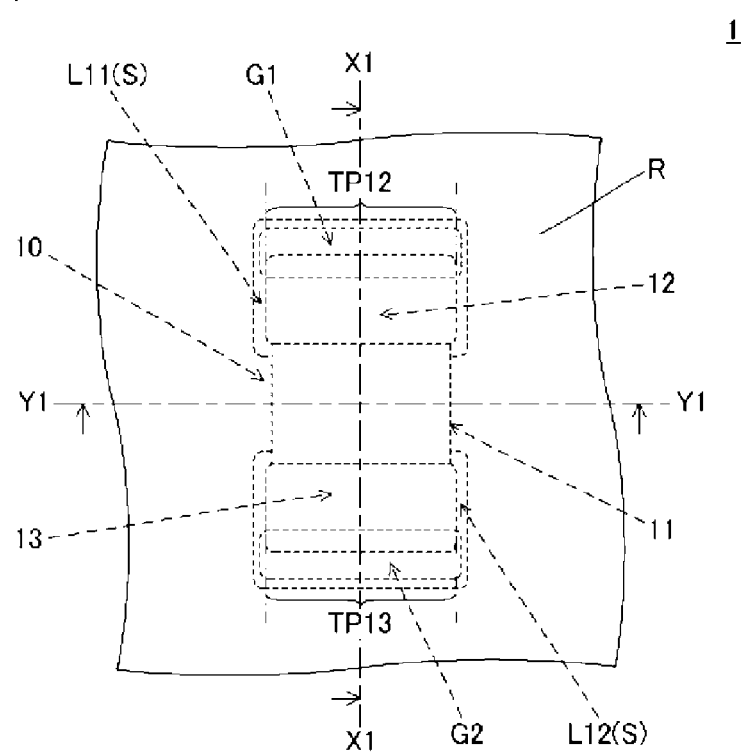
FIG. 1 is a top view of a built-in-electronic-component substrate according to a first preferred embodiment of the present invention.

FIG. 1 is a top view of the built-in-electronic-component substrate 1 according to the first preferred embodiment of the present invention. FIG. 2A is a sectional view taken in the direction of arrows of a plane including the line Y1-Y1 in FIG. 1. FIG. 2B is a sectional view taken in the direction of arrows of a plane including the line X1-X1 in FIG. 1.

The built-in-electronic-component substrate 1 according to the first preferred embodiment of the present invention includes a core substrate B, an electronic component 10 mounted on one main surface of the core substrate B and a resin layer R provided on the one main surface of the core substrate B such that the electronic component 10 is embedded thereinside.

Figure 17:
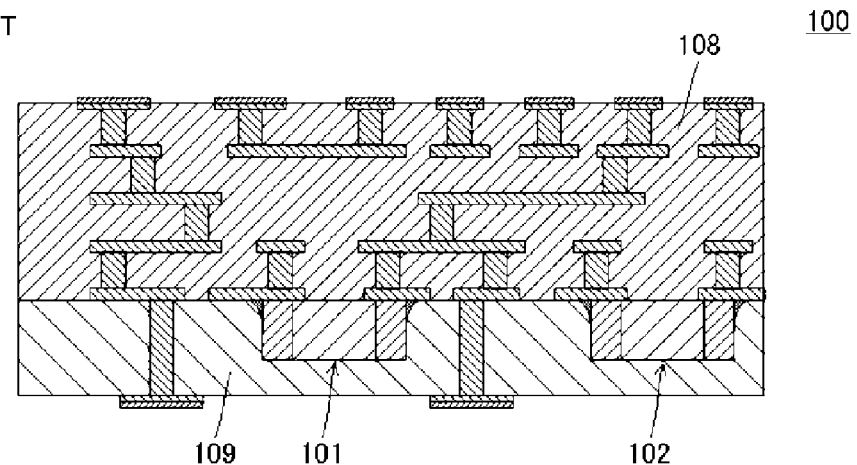
FIG. 17 is a sectional view of a built-in-electronic-component substrate of the background art.
Figure 18:
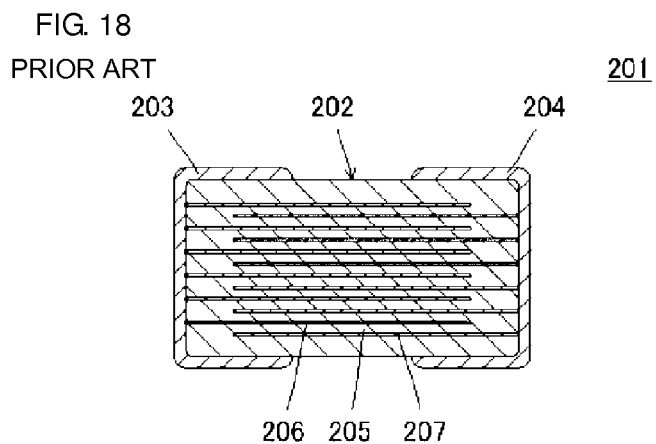
FIG. 18 is a sectional view of a multilayer ceramic capacitor for explaining a problem to be solved by various preferred embodiments of the present invention.
Figure 19A:
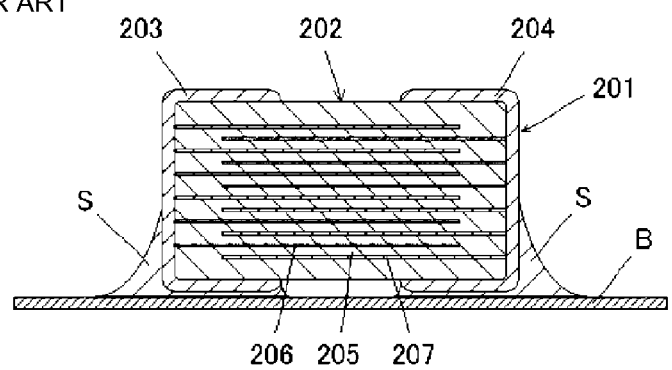
FIGS. 19A and 19B are sectional views of a state in which the multilayer ceramic capacitor has been mounted on a substrate for explaining the problem to be solved by various preferred embodiments of the present invention, where
Figure 19B:
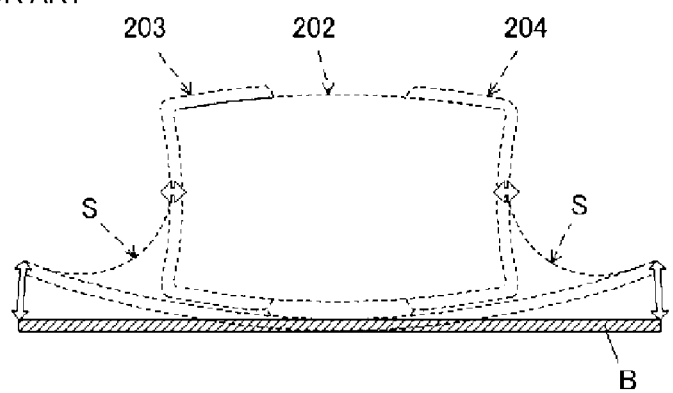

The core substrate B is a multilayer substrate corresponding to the substrate in the previously mentioned FIG. 17 and is illustrated in a simplified manner with illustration of inner electrodes, vias and so forth being omitted. In addition, in the first preferred embodiment of the present invention, the relationship between the size of the core substrate B and the size of the electronic component 10 is different than the actual relationship in order to place emphasis on the electronic component 10.

In this preferred embodiment, the electronic component is a multilayer ceramic capacitor including a ceramic multilayer body 11, a first outer electrode 12 and a second outer electrode 13. The ceramic multilayer body 11 has a structure in which an electrostatic capacitance exhibiting portion CP is sandwiched between a first ceramic protective portion P1 and a second ceramic protective portion P2. The electrostatic capacitance exhibiting portion CP is defined by capacitor elements stacked on top of one another. In each of the capacitor elements, a ceramic dielectric layer 14 is interposed between a first inner electrode 15 and a second inner electrode 16.

In this preferred embodiment, the electronic component is mounted on the core substrate B such that a stacking direction, which is a direction in which capacitor elements of the ceramic multilayer body 11 are stacked, is perpendicular or substantially perpendicular to the one main surface of the core substrate B. Therefore, a portion of the ceramic multilayer body 11 below the electrostatic capacitance exhibiting portion CP, that is, a portion located between the electrostatic capacitance exhibiting portion CP and the one main surface of the core substrate B defines the first protective portion P1 and a portion of the ceramic multilayer body 11 above the electrostatic capacitance exhibiting portion CP defines the second protective portion P2.

Due to the ceramic dielectric layers 14 exhibiting electrostrictive characteristics or the inverse piezoelectric effect, strain is generated in the electronic component 10 including the ceramic dielectric layers 14 when a voltage is applied. Representative examples of a ceramic material exhibiting electrostrictive characteristics or the inverse piezoelectric effect are high-dielectric-constant ceramic materials having barium titanate as a base material.

In this preferred embodiment, a multilayer ceramic capacitor is exemplified as the electronic component 10 as described above, but various preferred embodiments of the present invention can also be applied to a multilayer metalized film capacitor, which is a multilayer capacitor in which the dielectric layers are formed of a resin material, defining the electronic component 10.

The ceramic multilayer body 11 includes two opposing end surfaces that are parallel or substantially parallel to the stacking direction of the capacitor elements and side surfaces that connect the two end surfaces to each other.

The first outer electrode 12 and the second outer electrode 13 are provided on surfaces of the ceramic multilayer body 11. The first outer electrode 12 includes an end surface portion TP12 provided on one end surface of the ceramic multilayer body 11. In addition, the second outer electrode 13 includes an end surface portion TP13 provided on the other end surface of the ceramic multilayer body 11. The end surface portion TP12 of the first outer electrode 12 and the end surface portion TP13 of the second outer electrode 13 need not cover the entireties of the end surfaces of the ceramic multilayer body 11.

The first outer electrode 12 is connected to the first inner electrodes 15 at the end surface portion TP12 and the second outer electrode 13 is connected to the second inner electrodes 16 at the end surface portion TP13.

Figure 2A:
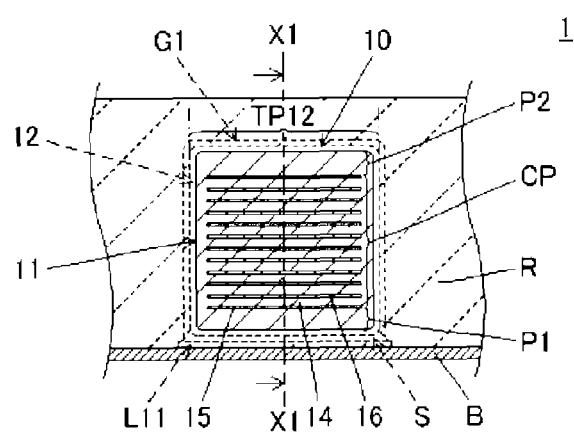
FIGS. 2A and 2B are sectional views of the built-in-electronic-component substrate according to the first preferred embodiment of the present invention, where
Figure 2B:
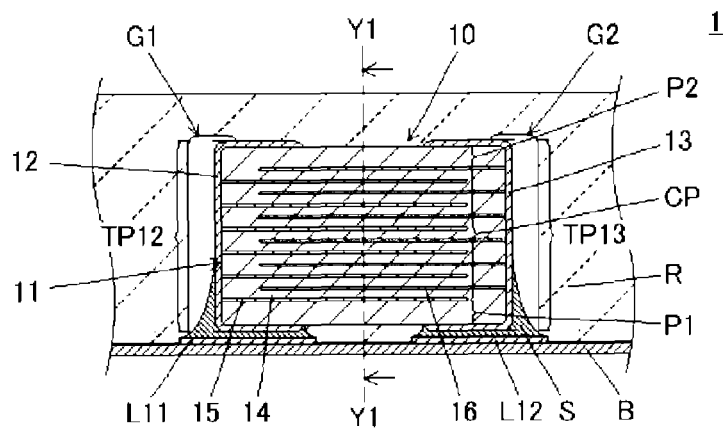

In FIGS. 2A and 2B, the electronic component 10 is mounted on the core substrate B by being connected to a first mounting land L11 and a second mounting land L12 using joining members S. The material of the first mounting land L11 and the second mounting land L12 and the material of the joining members S can be suitably selected and used from among existing materials. The first mounting land L11 and the second mounting land L12 are located on top of wiring including a conductive pattern, which is not illustrated. A voltage is applied to the electronic component 10 through this wiring.

A plurality of electronic components 10 may be mounted in the built-in-electronic-component substrate 1 according to the first preferred embodiment of the present invention. In addition, electronic components other than a multilayer ceramic capacitor may be similarly mounted in the built-in-electronic-component substrate 1.

Since a high-dielectric-constant ceramic material having barium titanate as a base material is often used in the electronic component 10 as described above, there is a fear that the electronic component 10, which is a multilayer ceramic capacitor, will vibrate due to strain when a voltage is applied thereto. This vibration would be transmitted to the substrate B, which is fixed to the electronic component 10, via the joining members S, but can also be transmitted to the substrate B via the resin layer R in the case where the electronic component 10 is embedded in the resin layer R.

However, in the built-in-electronic-component substrate 1 according to the first preferred embodiment of the present invention, a first gap G1 is provided between the resin layer R and the end surface portion TP12 of the first outer electrode 12 and the joining member S on the end surface portion TP12. In addition, a second gap G2 is provided between the resin layer R and the end surface portion TP13 of the second outer electrode 13 and the joining member S on the end surface portion TP13.

In other words, in the built-in-electronic-component substrate 1 according to the first preferred embodiment of the present invention, even if strain is generated due to application of a voltage to the electronic component 10, the strain in the vicinities of the end surfaces of the electronic component 10 is not transmitted to the resin layer R since the first gap G1 and the second gap G2 have been provided.

Therefore, the transmission of strain in the vicinities of end surfaces of the electronic component 10 to the core substrate B via the resin layer R is blocked and therefore vibration of the built-in-electronic-component substrate 1 is reduced and generation of audible sound by the vibration is significantly reduced or prevented.

In FIG. 1 and FIGS. 2A and 2B, the first gap G1 and the second gap G2 have the same shape as each other, but not limited to this, the first gap G1 and the second gap G2 may have non-symmetrical shapes.

In addition, in FIG. 1 and FIGS. 2A and 2B, the thickness of the first protective portion P1 and the thickness of the second protective portion P2 of the ceramic multilayer body 11 are preferably the same or substantially the same. However, the thickness of the first protective portion P1 of the electronic component 10 may be larger than the thickness of the second protective portion P2.

Figure 3A:
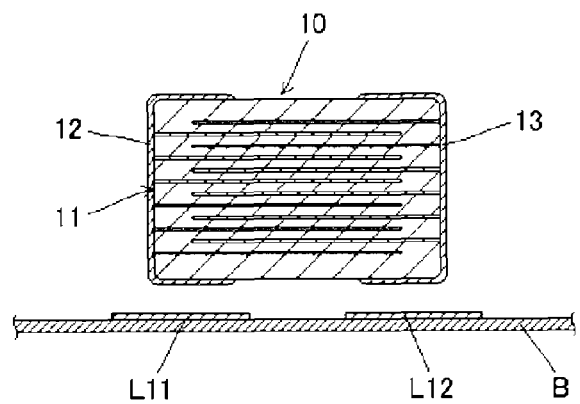
FIGS. 3A to 3C are diagrams for explaining an example of a manufacturing method for the built-in-electronic-component substrate according to the first preferred embodiment of the present invention illustrated in FIGS. 1 and 2A and 2B, where FIGS. 3A and 3B schematically illustrate a mounting step and FIG. 3C schematically illustrates a step of providing gap forming members.
Figure 3B:
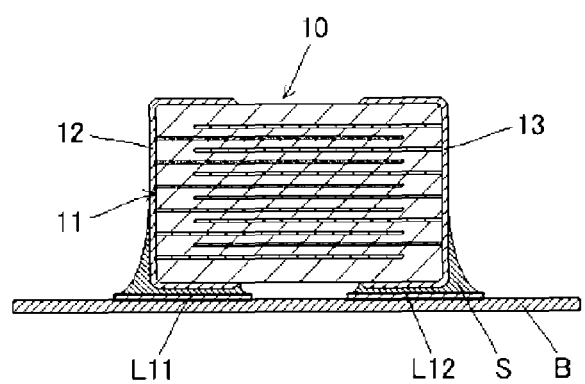
Figure 3C:
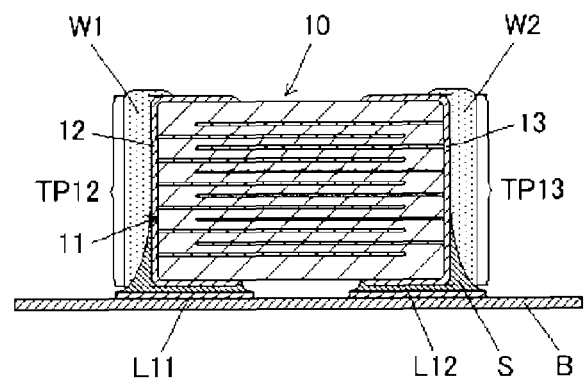
Figure 4A:
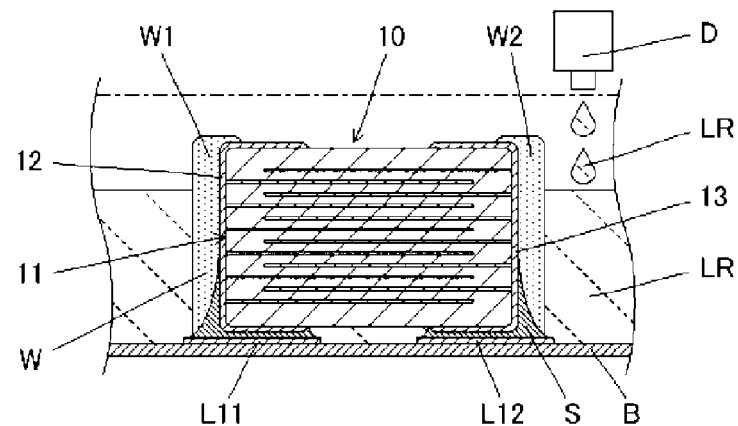
FIGS. 4A to 4C are diagrams for explaining an example of a manufacturing method for the built-in-electronic-component substrate according to the first preferred embodiment of the present invention illustrated in FIGS. 1 and 2A and 2B, where FIG. 4A schematically illustrates a step of providing an uncured resin layer and FIGS. 4B and 4C schematically illustrate a step of forming a resin layer.
Figure 4B:
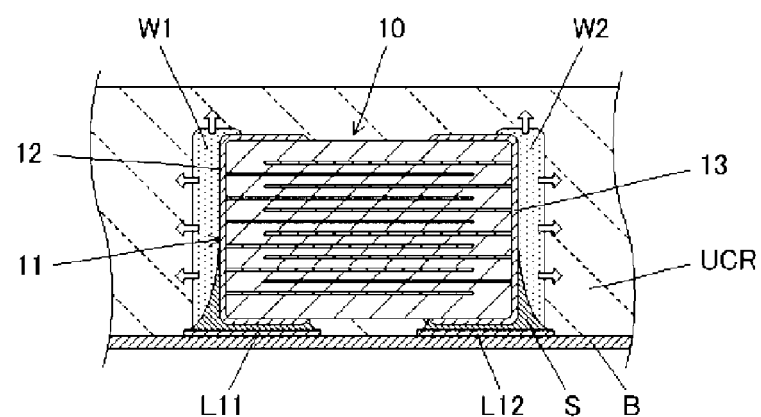
Figure 4C:
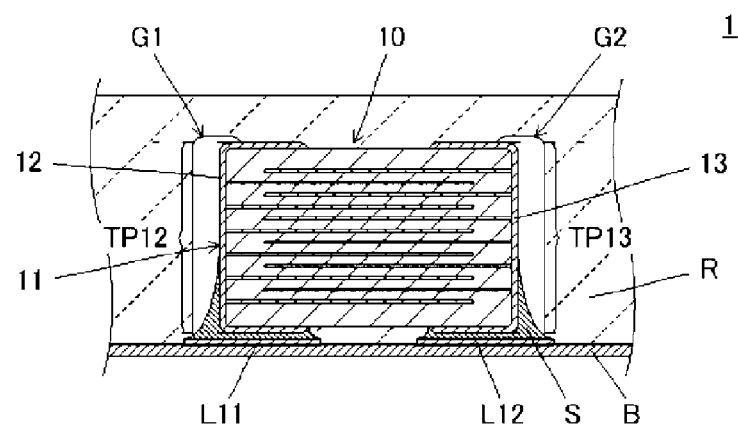

An example of a manufacturing method for the built-in-electronic-component substrate 1 according to the first preferred embodiment of the present invention will be described using FIGS. 3A to 3C and FIGS. 4A to 4C. FIGS. 3A and 3B schematically illustrate a mounting step, FIG. 3C schematically illustrates a step of providing gap forming members, FIG. 4A schematically illustrates a step of providing an uncured resin layer, and FIGS. 4B and 4C schematically illustrate a step of forming a resin layer carried out in this order in an example of a manufacturing method for the built-in-electronic-component substrate 1. FIGS. 3A to 3C and FIGS. 4A to 4C correspond to the sectional view (FIG. 2B) taken in the direction of arrows of a plane including the line X1-X1 in FIG. 1.

FIGS. 3A and 3B schematically illustrate a mounting step of the manufacturing method for the built-in-electronic-component substrate 1. With this mounting step, the electronic component 10 is mounted on the one main surface of the core substrate B.

FIG. 3A illustrates a stage at which the electronic component 10 and the core substrate B on which the electronic component 10 is to be mounted are prepared. The electronic component 10 has the above-described structure and is a multilayer ceramic capacitor in which strain is generated when a voltage is applied. The core substrate B is equipped with the first mounting land L11 and the second mounting land L12 for joining the electronic component 10 thereto.

FIG. 3B illustrates a stage at which the electronic component 10 has been mounted on the one surface of the core substrate B by being connected to the first mounting land L11 and the second mounting land L12 using the joining members S.

FIG. 3C schematically illustrates a step of providing the gap forming members in the manufacturing method for the built-in-electronic-component substrate 1. With the step of providing the gap forming members, a first gap forming member W1 is provided on the end surface portion TP12 of the first outer electrode 12 and on the joining member S on the end surface portion TP12 and a second gap forming member W2 is provided on the end surface portion TP13 of the second outer electrode 13 and on the joining member S on the end surface portion TP13.

FIG. 3C illustrates the case where the first gap forming member W1 and the second gap forming member W2 provided on the end surfaces portions and joining members S are formed using the same material and have the same volume, for example.

The first gap forming member W1 and the second gap forming member W2 are formed of a material that is solid or semi-solid at room temperature and that is easily liquefied by being softened with heat and for example a wax or paraffin wax can be used. The material for forming the first gap forming member W1 and the second gap forming member W2 can be provided in a liquid state on the end surface portions and on the joining members by using a dispenser, for example, which is not illustrated. Alternatively, the material for forming the gap forming members may be adhered to the end surface portions and the joining members in a semi-cured state.

The first gap forming member W1 and the second gap forming member W2 may be formed of different materials. In addition, the first gap forming member W1 and the second gap forming member W2 may have different volumes.

FIG. 4A schematically illustrates a step of providing an uncured resin layer in the manufacturing method for the built-in-electronic-component substrate 1. With the step of providing the uncured resin layer, an uncured resin layer UCR is provided on the one main surface of the core substrate B and the electronic component 10 and the first gap forming member W1 and the second gap forming member W2 are embedded inside the uncured resin layer UCR.

FIG. 4A illustrates a state in which a liquid resin LR is applied using a dispenser D, for example, to the one main surface of the core substrate B on which the electronic component 10 and the first gap forming member W1 and the second gap forming member W2 have been provided to a certain thickness indicated by a one-dot chain line.

The device used to apply the liquid resin LR is not limited to the dispenser D and any existing application device can be used. For example, various types of coater such as a curtain coater or a spin coater may be used.

In addition, the liquid resin LR is not limited to being a resin composed of a single resin material and a resin including a glass material or silica as a filler inside a resin material can be used.

This step is not limited to a method in which a liquid resin LR is applied as in FIG. 4A and the uncured resin layer UCR may be provided by arranging a semi-cured sheet-shaped pre-preg on the one main surface of the core substrate B and performing pressing so that the electronic component 10 and the first gap forming member W1 and the second gap forming member W2 become embedded.

FIGS. 4B and 4C schematically illustrate a step of forming a resin layer in the manufacturing method for the built-in-electronic-component substrate 1. With the step of forming the resin layer, the uncured resin layer UCR is thermally cured and thus the resin layer R in which the electronic component 10 is embedded is provided on the one main surface of the core substrate B. At this time, the first gap G1 is formed between the resin layer R and the end surface portion TP12 of the first outer electrode 12 and the joining member S on the end surface portion TP12 and the second gap G2 is formed between the resin layer R and the end surface portion TP13 of the second outer electrode 13 and the joining member S on the end surface portion TP13.

FIG. 4B illustrates a stage in which the uncured resin layer UCR in which the electronic component 10 and the first gap forming member W1 and the second gap forming member W2 are embedded is thermally cured and the first gap forming member W1 and the second gap forming member W2 are removed by being subjected to heating.

Removal of the first gap forming member W1 and the second gap forming member W2 by heating and formation of the gaps (cavities) that occurs with this removal is performed using a so-called lost wax process as described in Japanese Examined Patent Application Publication No. 45-22384, for example. That is, the first gap forming member W1 and the second gap forming member W2 are absorbed into the uncured resin layer UCR at the time of thermal curing of the uncured resin layer UCR or are absorbed into the resin layer R as a result of heating performed after the curing of the uncured resin layer UCR and as a result the gaps are formed by the spaces left by the gap forming members.

At a result, the first gap G1 is formed between the resin layer R and the end surface portion TP12 of the first outer electrode 12 and the joining member S on the end surface portion TP12 and the second gap G2 is formed between the resin layer R and the end surface portion TP13 of the second outer electrode 13 and the joining member S on the end surface portion TP13.

FIG. 4C illustrates a stage at which the built-in-electronic-component substrate 1 according to the first preferred embodiment of the present invention has been completed, the built-in-electronic-component substrate 1 having on the one main surface of the core substrate B the resin layer R in which the electronic component 10 is embedded and the first gap G1 and the second gap G2 have been formed through the above-described step.

It is preferable that the thickness of the resin layer R be adjusted by applying the liquid resin LR onto the core substrate B while taking into account the change in volume that will occur in the uncured resin layer UCR at the time of curing. In addition, the thickness of the resin layer may be adjusted to a desired value by generously applying the liquid resin LR and then removing the excess resin after curing.

First Modification of First Preferred Embodiment

A first modification 1A of the built-in-electronic-component substrate according to the first preferred embodiment of the present invention will be described using FIGS. 5 and 6A to 6C.

The first modification 1A of the built-in-electronic-component substrate according to the first preferred embodiment of the present invention differs from the above-described built-in-electronic-component substrate 1 in terms of the form of the gaps formed between the resin layer R and the electronic component 10 and is the same as the built-in-electronic-component substrate 1 in other respects, and therefore the description of common elements and features will be omitted. The core substrate B is illustrated in a simplified manner similarly to as in the above-described first preferred embodiment.

Figure 5:
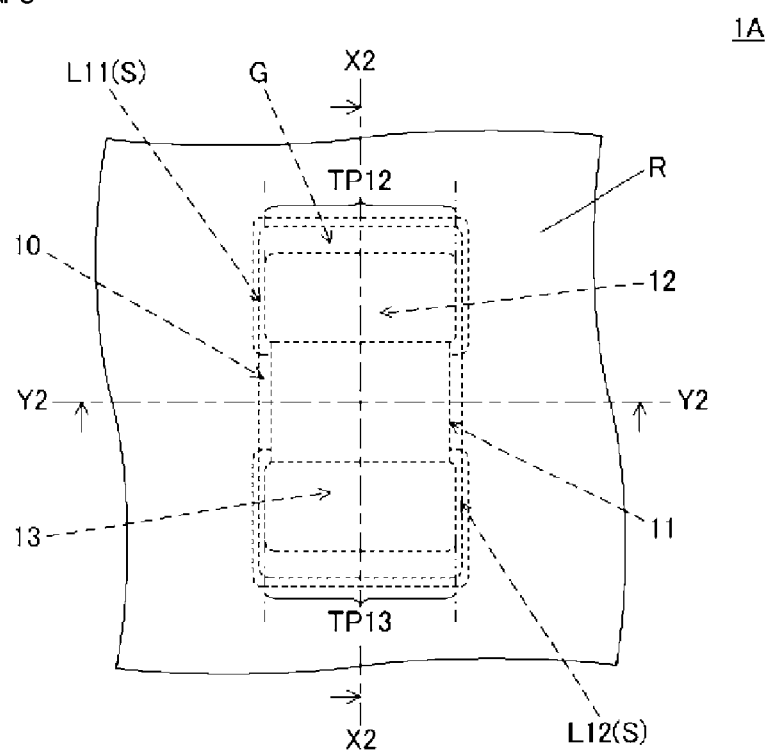
FIG. 5 is a top view of a first modification of the built-in-electronic-component substrate according to the first preferred embodiment of the present invention and corresponds to FIG. 1.
Figure 6A:
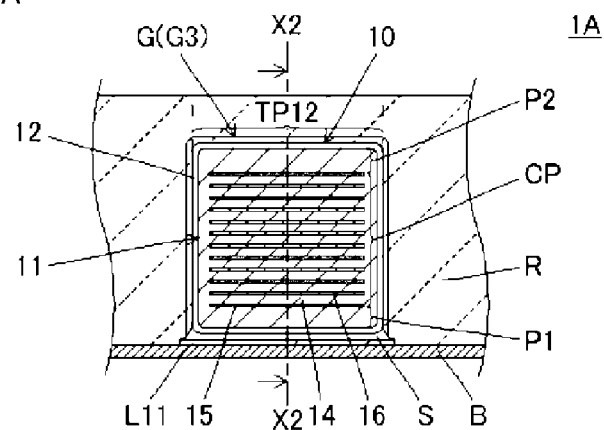
FIGS. 6A to 6C are sectional views of the first modification of the built-in-electronic-component substrate according to the first preferred embodiment of the present invention and correspond to FIGS. 2A and 2B.
Figure 6B:
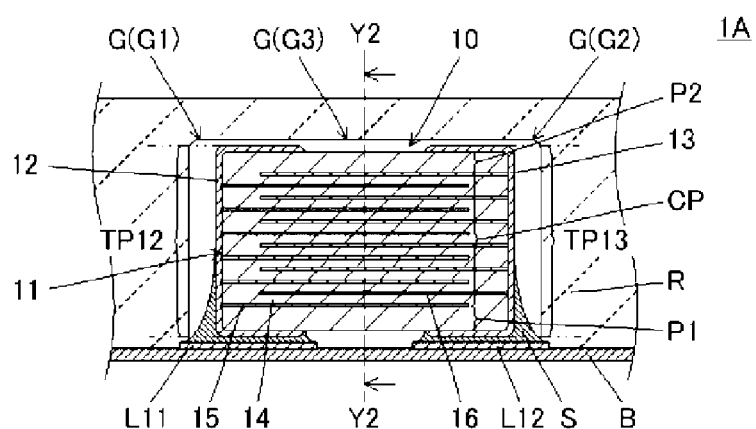

FIG. 5 is a top view of the first modification 1A of the built-in-electronic-component substrate according to the first preferred embodiment of the present invention. FIG. 6A is a sectional view taken in the direction of arrows of a plane including the line Y2-Y2 in FIG. 5. FIG. 6B is a sectional view taken in the direction of arrows of a plane including the line X2-X2 in FIG. 5.

In the first modification 1A of the built-in-electronic-component substrate according to the first preferred embodiment of the present invention, a third gap G3 is additionally provided between the resin layer R and a portion of the ceramic multilayer body 11 not covered by the first outer electrode 12 and the second outer electrode 13.

FIG. 6B illustrates a case in which the third gap G3 is provided so as to surround side surfaces of the ceramic multilayer body 11 in an annular manner and is connected to the first gap G1 and the second gap G2 to define a single integrated gap G.

The first modification 1A of the built-in-electronic-component substrate according to the first preferred embodiment is manufactured by providing gap forming members so as to surround the electronic component 10 mounted on the one main surface of the core substrate B in the step of providing gap forming members in the manufacturing method for the built-in-electronic-component substrate described above, and then forming the gaps using a lost wax process as described above.

That is, in the first modification 1A of the built-in-electronic-component substrate according to the first preferred embodiment of the present invention, even if strain is generated when a voltage is applied to the electronic component 10, since the third gap G3 is formed in addition to the first gap G1 and the second gap G2, strain in the vicinities of the end surfaces and side surfaces of the electronic component 10 is not transmitted to the resin layer.

Therefore, transmission of strain from the electronic component 10 to the core substrate B via the resin layer R is further blocked and as a result vibration of the built-in-electronic-component substrate of the first modification 1A is further reduced and generation of audible sound by the vibration is effectively significantly reduced or prevented.

Figure 6C:
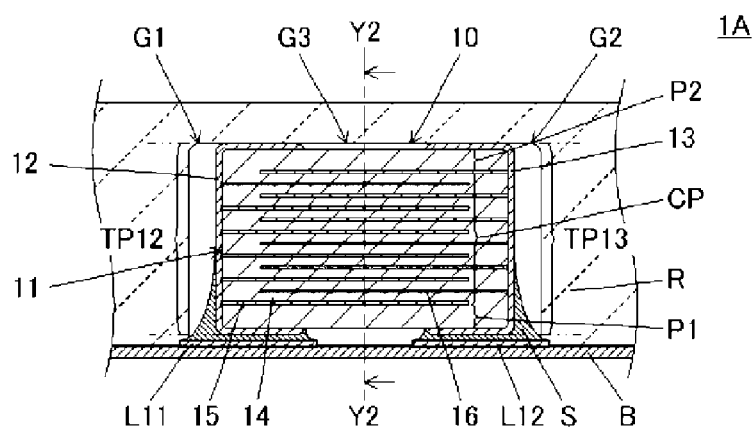

In FIG. 6B, a case is illustrated in which a gap G is formed by integrating the first gap G1, the second gap G2 and the third gap G3 with each other. However, as illustrated in FIG. 6C, the gaps may be formed so as to be separate from each other. In this case, since gaps over side surface portions of the first outer electrode 12 and the second outer electrode 13 are eliminated, the profile of the built-in-electronic-component substrate of the first modification 1A is significantly reduced.

Second Modification of First Preferred Embodiment

A second modification 1B of the built-in-electronic-component substrate according to the first preferred embodiment of the present invention will be described using FIGS. 7 and 8A to 8C.

The second modification 1B of the built-in-electronic-component substrate according to the first preferred embodiment of the present invention differs from the above-described built-in-electronic-component substrate 1 in terms of the form of the electronic component 10 and is the same as the built-in-electronic-component substrate 1 in other respects and therefore the description of common elements and features will be omitted. The core substrate B is illustrated in a simplified manner similarly to as in the above-described first preferred embodiment.

Figure 7:
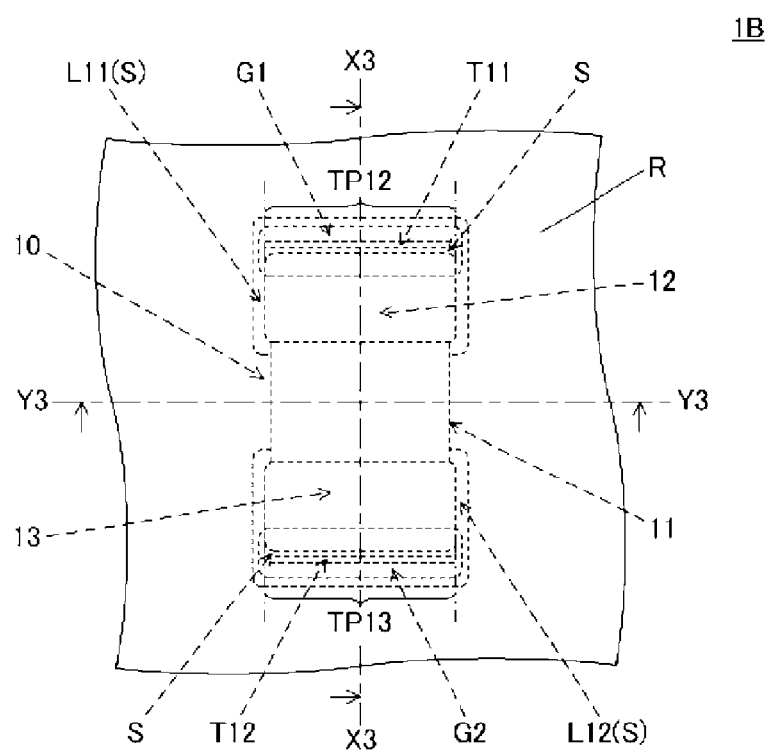
FIG. 7 is a top view of a second modification of the built-in-electronic-component substrate according to the first preferred embodiment of the present invention and corresponds to FIG. 1.
Figure 8A:
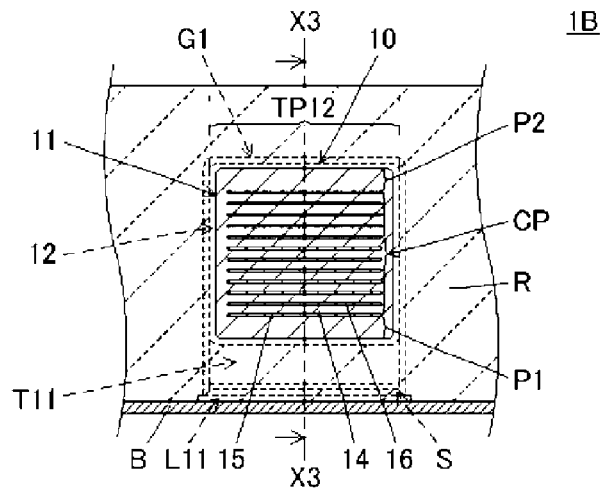
FIGS. 8A to 8C are sectional views of the second modification of the built-in-electronic-component substrate according to the first preferred embodiment of the present invention and correspond to FIGS. 2A and 2B.
Figure 8B:
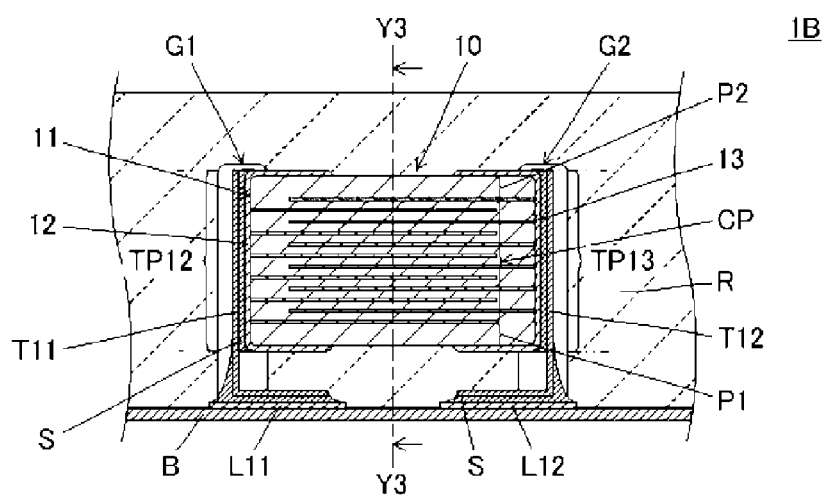

FIG. 7 is a top view of the second modification 1B of the built-in-electronic-component substrate according to the first preferred embodiment of the present invention. FIG. 8A is a sectional view taken in the direction of arrows of a plane including the line Y3-Y3 in FIG. 7. FIG. 8B is a sectional view taken in the direction of arrows of a plane including the line X3-X3 in FIG. 7.

In the second modification 1B of the built-in-electronic-component substrate according to the first preferred embodiment of the present invention, the electronic component 10 includes a first electrode terminal T11 attached to the first outer electrode 12 by the joining member S and a second electrode terminal T12 attached to the second outer electrode 13 by the joining member S. The electronic component 10 is mounted on the core substrate B by respectively connecting first electrode terminal T11 and the second electrode terminal T12 to the first mounting land L11 and the second mounting land L12 using the joining members S.

In the above-described second modification 1B of the built-in-electronic-component substrate as well, a gap is provided between the resin layer R and the end surface portions of the outer electrodes and the joining members S on the end surface portions similarly to as in the above-described built-in-electronic-component substrate 1, and as a result vibration of the built-in-electronic-component substrate of the second modification 1B is reduced and in addition generation of audible sound by the vibration is significantly reduced or prevented.

Figure 8C:
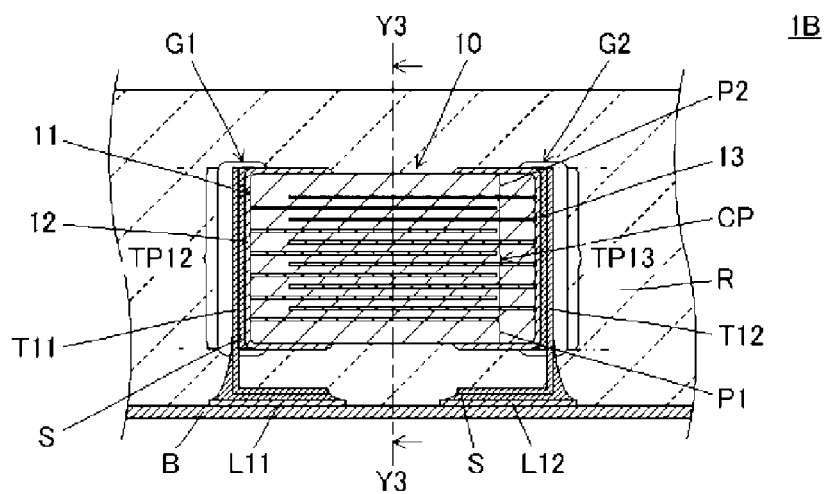

In FIG. 8B, a case is illustrated in which the first gap G1 and the second gap G2 respectively extend up to the first mounting land L11 and the second mounting land L12. However, as illustrated in FIG. 8C, the first gap G1 and second gap G2 may extend partially along portions of the first electrode terminal T11 and the second electrode terminal T12 standing upright with respect to the core substrate B.

Third Modification of First Preferred Embodiment

A third modification 1C of the built-in-electronic-component substrate according to the first preferred embodiment of the present invention will be described using FIGS. 9 and 10A to 10C.

The third modification 1C of the built-in-electronic-component substrate according to the first preferred embodiment of the present invention differs from the above-described built-in-electronic-component substrate 1 in terms of the form of the electronic component 10 similarly to the second modification 1B and is the same as the built-in-electronic-component substrate 1 in other respects and therefore the description of common elements and features will be omitted. The core substrate B is illustrated in a simplified manner similarly to as in the above-described first preferred embodiment.

Figure 9:
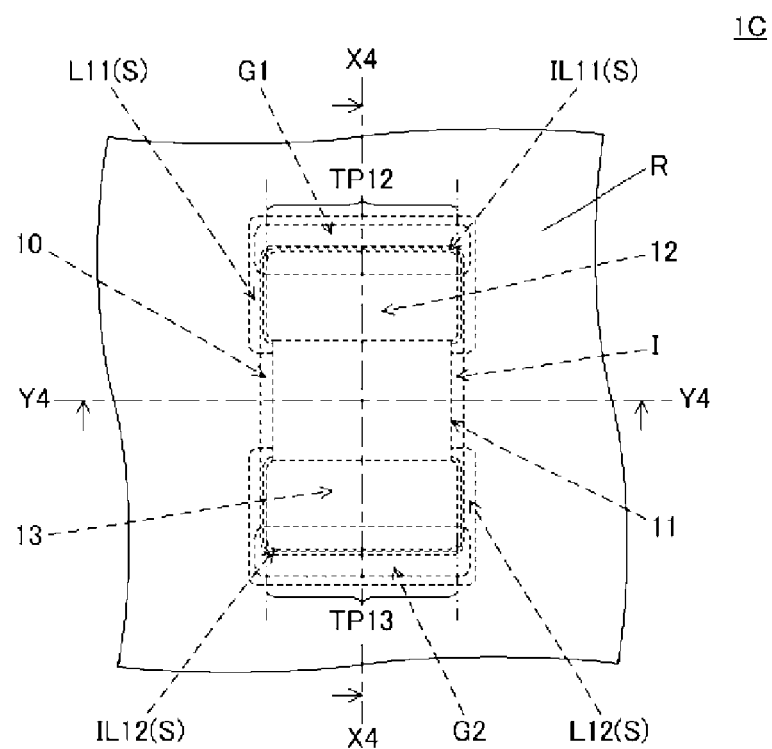
FIG. 9 is a top view of a third modification of the built-in-electronic-component substrate according to the first preferred embodiment of the present invention and corresponds to FIG. 1.
Figure 10A:
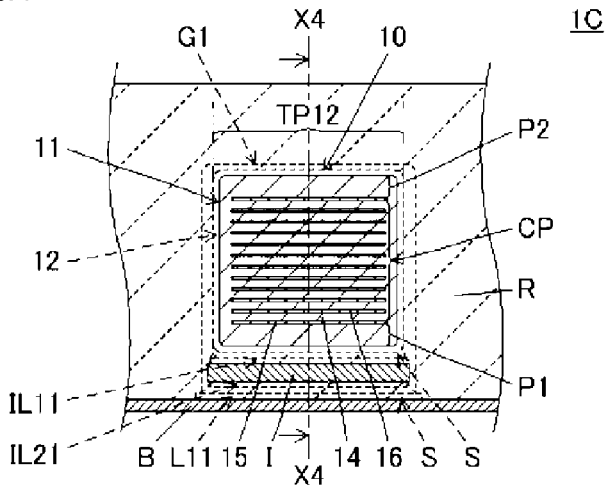
FIGS. 10A to 10C are sectional views of the third modification of the built-in-electronic-component substrate according to the first preferred embodiment of the present invention and correspond to FIGS. 2A and 2B.
Figure 10B:
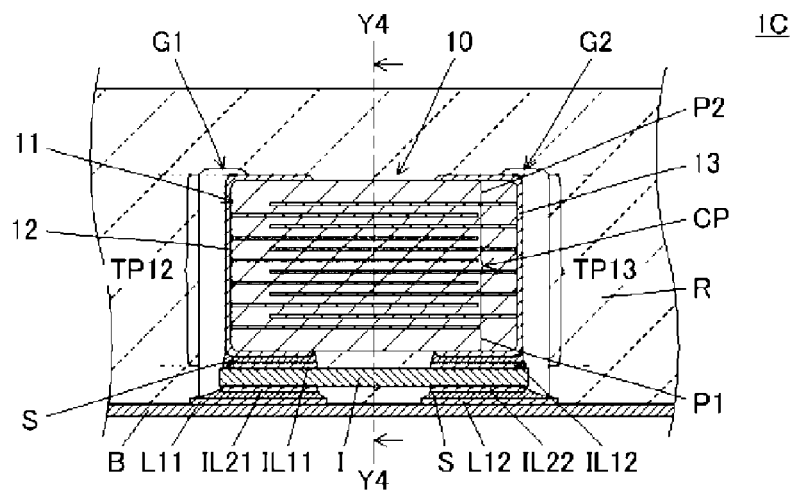

FIG. 9 is a top view of the third modification 1C of the built-in-electronic-component substrate according to the first preferred embodiment of the present invention. FIG. 10A is a sectional view taken in the direction of arrows of a plane including the line Y4-Y4 in FIG. 9. FIG. 10B is a sectional view taken in the direction of arrows of a plane including the line X4-X4 in FIG. 9.

In the third modification 1C of the built-in-electronic-component substrate according to the first preferred embodiment of the present invention, the electronic component 10 includes a so-called interposer I. The interposer I includes one main surface and another main surface that are substantially parallel or substantially parallel to each other, a first intermediary land IL11 and a second intermediary land IL12 are provided on the one main surface and a third intermediary land IL21 and a fourth intermediary land IL22 are provided on the other main surface. The first intermediary land IL11 and the second intermediary land IL12 are respectively electrically connected to the third intermediary land IL21 and the fourth intermediary land IL22.

The first intermediary land IL11 and the second intermediary land IL12 of the interposer I are respectively connected to the first outer electrode 12 and the second outer electrode 13 by joining members S. In addition, the third intermediary land IL21 and the fourth intermediary land IL22 provided on the other main surface of the interposer I are respectively connected to the first mounting land L11 and the second mounting land L12 on the core substrate B by joining members S.

As a result, the first outer electrode 12 is connected to the first mounting land L11 via the interposer I. In addition, the second outer electrode 13 is connected to the second mounting land L12 via the interposer I.

In the above-described third modification 1C of the built-in-electronic-component substrate as well, gaps are provided between the resin layer R and the end surface portions of the outer electrodes and the joining members S on the end surface portions similarly to as in the above-described built-in-electronic-component substrate 1, and as a result, vibration of the built-in-electronic-component substrate of the third modification 1C is reduced and in addition generation of audible sound by the vibration is significantly reduced or prevented.

Figure 10C:
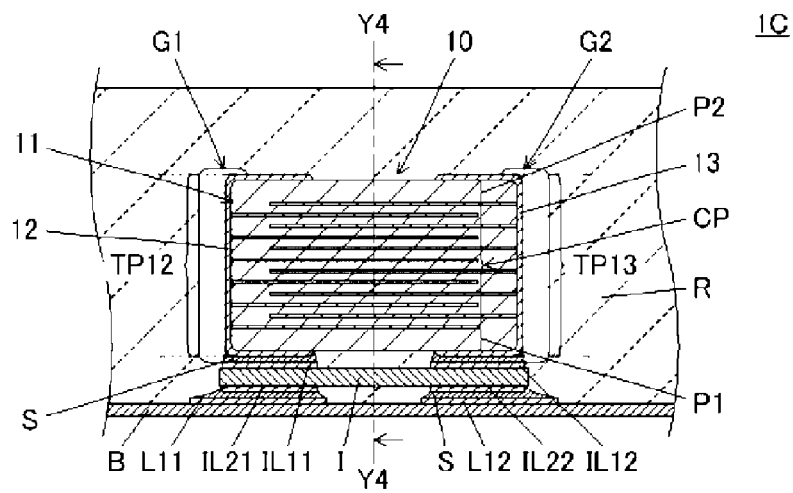

A case is illustrated in FIG. 10B in which the first gap G1 and the second gap G2 respectively extend up to the first mounting land L11 and the second mounting land L12, but the first gap G1 and the second gap G2 may instead extend up to the interposer I as illustrated in FIG. 10C.

Second Preferred Embodiment

A built-in-electronic-component substrate 1D according to a second preferred embodiment of the present invention will be described using FIG. 11 and FIGS. 12A and 12B.

The built-in-electronic-component substrate 1D according to the second preferred embodiment of the present invention differs from the above-described built-in-electronic-component substrate 1 in that insertion members are provided in the gaps between the resin layer R and the electronic component and is the same as the built-in-electronic-component substrate 1 in other respects and therefore the description of common elements and features will be omitted. The core substrate B is illustrated in a simplified manner similarly to as in the above-described first preferred embodiment.

Figure 11:
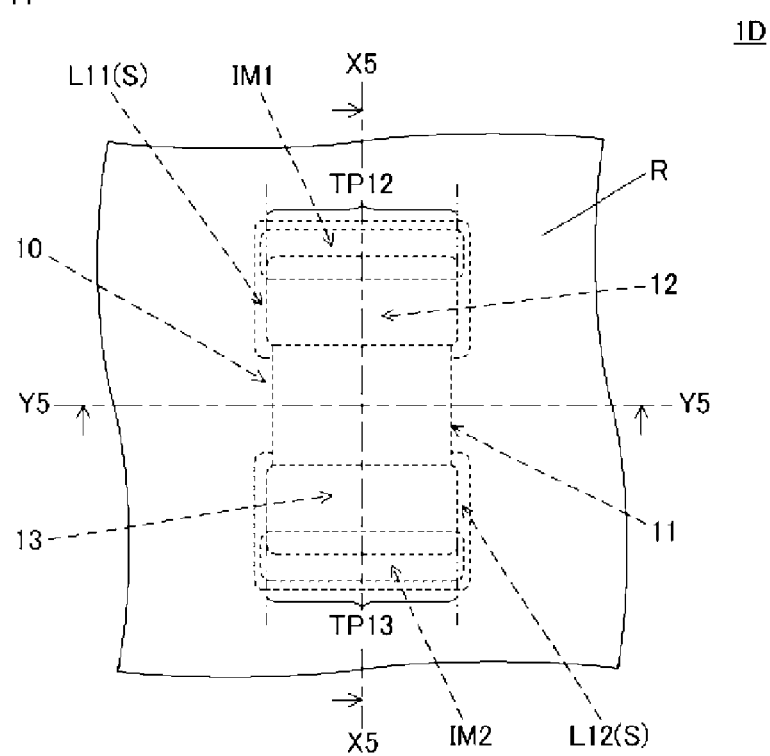
FIG. 11 is a top view of a built-in-electronic-component substrate according to a second preferred embodiment of the present invention.

FIG. 11 is a top view of the built-in-electronic-component substrate 1D according to the second preferred embodiment of the present invention. FIG. 12A is a sectional view taken in the direction of arrows of a plane including the line Y5-Y5 in FIG. 11. FIG. 12B is a sectional view taken in the direction of arrows of a plane including the line X5-X5 in FIG. 11.

In the built-in-electronic-component substrate 1D according to the second preferred embodiment of the present invention, a first insertion member IM1, which has a lower elasticity than the resin layer R, is provided in the first gap G1 and a second insertion member IM2, which has a lower elasticity than the resin layer R, is provided in the second gap G2.

That is, in the built-in-electronic-component substrate 1D according to the second preferred embodiment of the present invention, even if strain is generated due to application of a voltage to the electronic component 10, the strain in the vicinities of the end surfaces of the electronic component 10 is alleviated by the first insertion member IM1 and the second insertion member IM2, which have a low elasticity and deform easily.

Therefore, the transmission of strain in the vicinities of end surfaces of the electronic component 10 to the core substrate B via the resin layer R is significantly reduced or prevented, and therefore vibration of the built-in-electronic-component substrate 1D is reduced and generation of audible sound by the vibration is significantly reduced or prevented.

In addition, by providing the first insertion member IM1 in the first gap G1 and the second insertion member IM2 in the second gap G2, the resin layer R in which gaps or hollows are provided is closer to being a resin layer in which gaps are not formed. Therefore, moisture resistance and the rigidity of the built-in-electronic-component substrate 1D is improved compared to those in a state where just the first gap G1 and the second gap G2 are formed.

Figure 12A:
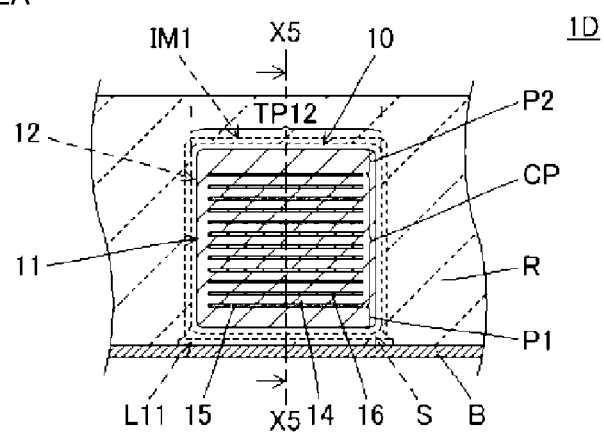
FIGS. 12A and 12B are sectional views of the built-in-electronic-component substrate according to the second preferred embodiment of the present invention, where
Figure 12B:
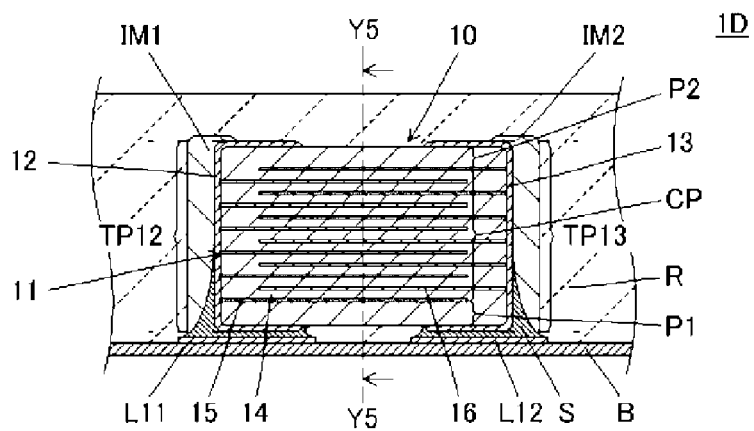

In FIG. 11 and FIGS. 12A to 12B, the first insertion member IM1 and the second insertion member IM2 preferably have the same or substantially the same shape, but not limited to this, the first insertion member IM1 and the second insertion member IM2 may have non-symmetrical shapes.

In addition, in FIG. 11 and FIGS. 12A and 12B, the thickness of the first protective portion P1 and the thickness of the second protective portion P2 of the ceramic multilayer body 11 are preferably the same or substantially the same. However, similarly to as in the first preferred embodiment, the thickness of the first protective portion P1 of the electronic component 10 may be larger than the thickness of the second protective portion P2.

Figure 13A:
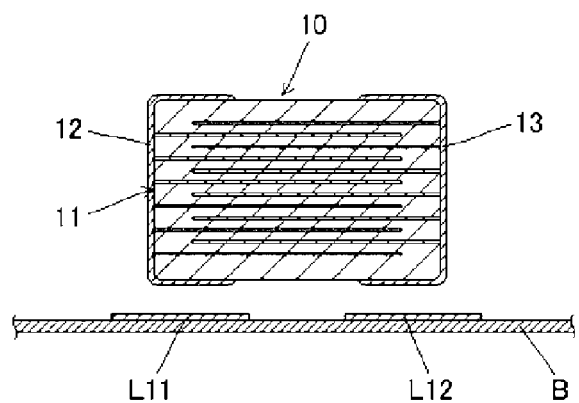
FIGS. 13A to 13C are diagrams for explaining an example of a manufacturing method for the built-in-electronic-component substrate according to the second preferred embodiment of the present invention illustrated in FIGS. 11 and 12A and 12B, where FIGS. 13A and 13B schematically illustrate a mounting step and FIG. 13C schematically illustrates a step of providing insertion members.
Figure 13B:
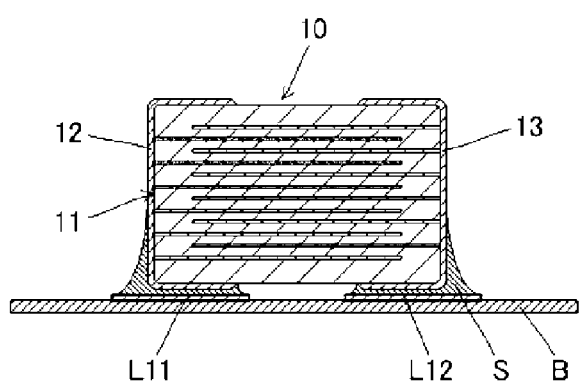
Figure 13C:
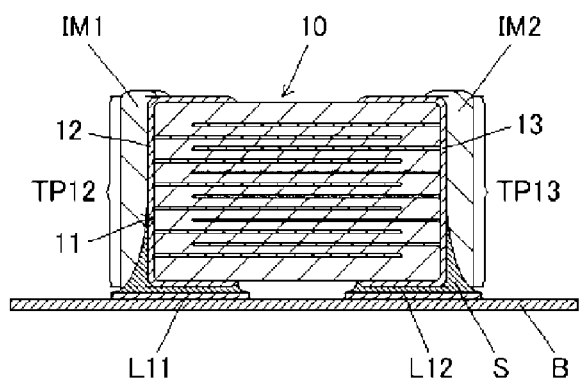
Figure 14A:
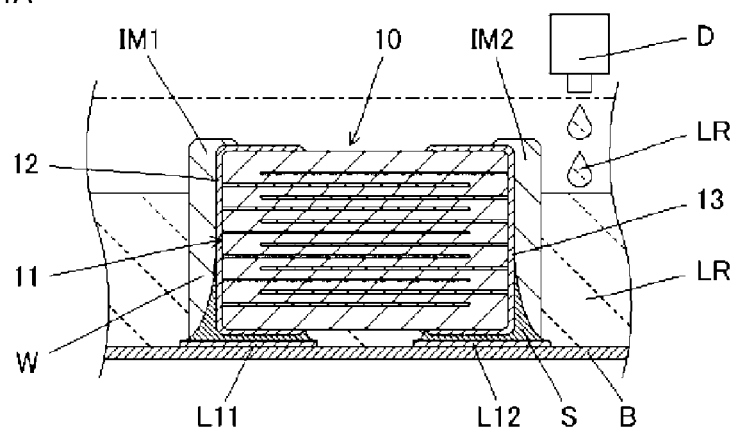
FIGS. 14A to 14C are diagrams for explaining an example of a manufacturing method for the built-in-electronic-component substrate according to the second preferred embodiment of the present invention illustrated in FIGS. 11 and 12A and 12B, where FIG. 14A schematically illustrates a step of providing an uncured resin layer and FIGS. 14B and 14C schematically illustrate a step of forming a resin layer.
Figure 14B:
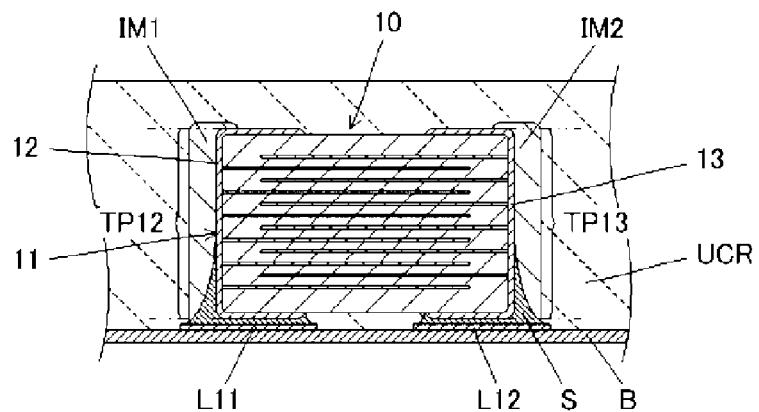
Figure 14C:
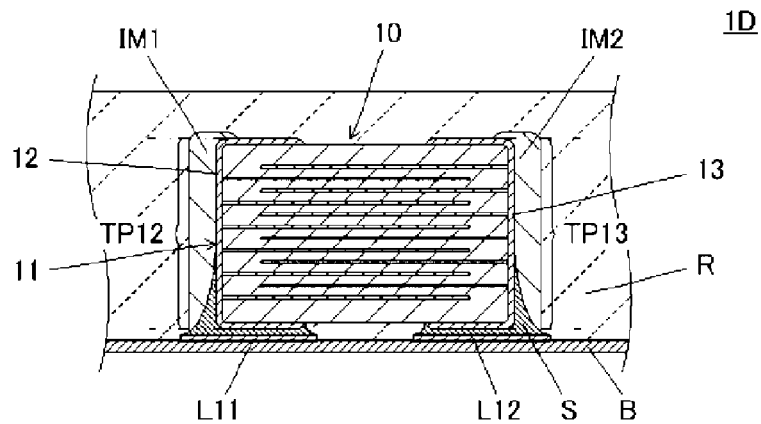

An example of a manufacturing method for the built-in-electronic-component substrate 1D according to the second preferred embodiment of the present invention will be described using FIGS. 13A to 13C and FIGS. 14A to 14C. FIGS. 13A and 13B schematically illustrate a mounting step, FIG. 13C schematically illustrates a step of providing insertion members, FIG. 14A schematically illustrates a step of providing an uncured resin layer, and FIGS. 14B and 14C schematically illustrate a step of forming a resin layer carried out in this order in an example of a manufacturing method for the built-in-electronic-component substrate 1D. FIGS. 13A to 13C and FIGS. 14A to 14C correspond to the sectional view (FIG. 12B) taken in the direction of arrows of a plane including the line X5-X5 in FIG. 11.

The manufacturing method for the built-in-electronic-component substrate 1D according to the second preferred embodiment of the present invention differs from the manufacturing method for the built-in-electronic-component substrate 1 according to the first preferred embodiment described above in that the step of providing the insertion members is included instead of the step of providing the gap forming members. Therefore, the step of providing the uncured resin layer buries the electronic component 10 and the insertion members and the step of forming the resin layer just thermally cures the uncured resin layer UCR.

These are not substantial differences and the rest of the content is the same as described above and therefore detailed description of substantially common content will be omitted and the description will mainly focus on the step of providing the insertion members.

FIGS. 13A and 13B schematically illustrate a mounting step of the manufacturing method for the built-in-electronic-component substrate 1D. With this mounting step, the electronic component 10 is mounted on the one main surface of the core substrate B.

FIG. 13C schematically illustrate the step of providing the insertion members in the manufacturing method for the built-in-electronic-component substrate 1D. With the step of providing the insertion members, the first insertion member IM1 is provided on the end surface portion TP12 of the first outer electrode 12 and on the joining member S on the end surface portion TP12 and the second insertion member IM2 is provided on the end surface portion TP13 of the second outer electrode 13 and on the joining member S on the end surface portion TP13.

FIG. 13C illustrates a case in which the first insertion member IM1 and the second insertion member IM2 provided on the end surface portions and the joining members are formed using the same material and so as to have the same volume.

The first insertion member IM1 and the second insertion member IM2 are formed of a material that is not easily softened and liquefied by heat and that has a lower elasticity than the resin layer R, and, for example, a low-elasticity resin having a softening point sufficiently higher than the heating temperature used in the step of forming the resin layer described later can be used. The material for forming the first insertion member IM1 and the second insertion member IM2 on the end surface portions and the joining members can be provided in a liquid state by using a dispenser, for example, which is not illustrated. Alternatively, the material for forming the insertion members may be adhered to the end surface portions and the joining members in a semi-cured state. In addition, a sponge-like resin molded into a predetermined shape may be fitted onto the two end surfaces of the electronic component 10.

The first insertion member IM1 and the second insertion member IM2 may be formed of different materials. In addition, the first insertion member IM1 and the second insertion member IM2 may have different volumes.

FIG. 14A schematically illustrates a step of providing an uncured resin layer in the manufacturing method for the built-in-electronic-component substrate 1D. With the step of providing the uncured resin layer, an uncured resin layer UCR is provided on the one main surface of the core substrate B and the electronic component 10 and the first insertion member IM1 and the second insertion member IM2 are embedded inside the uncured resin layer UCR.

FIGS. 14B and 14C schematically illustrate a step of forming a resin layer in the manufacturing method for the built-in-electronic-component substrate 1D. With the step of forming the resin layer, the uncured resin layer UCR is thermally cured and thus the resin layer R in which the electronic component 10 is embedded is provided on the one main surface of the core substrate B.

With this step, the built-in-electronic-component substrate 1D according to the second preferred embodiment of the present invention that includes on the one main surface of the core substrate B the resin layer R in which the electronic component 10 is embedded and in which the first insertion member IM1 and the second insertion member IM2 are formed is completed.

Modification of Second Preferred Embodiment

A modification 1E of the built-in-electronic-component substrate according to the second preferred embodiment of the present invention will be described using FIG. 15 and FIGS. 16A to 16C.

The modification 1E of the built-in-electronic-component substrate according to the second preferred embodiment of the present invention differs from the above-described built-in-electronic-component substrate 1D in terms of the form of the insertion members arranged between the resin layer R and the electronic component 10 and is the same as the built-in-therefore the description of common elements and features will be omitted. The core substrate B is illustrated in a simplified manner similarly to as in the above-described second preferred embodiment.

Figure 15:
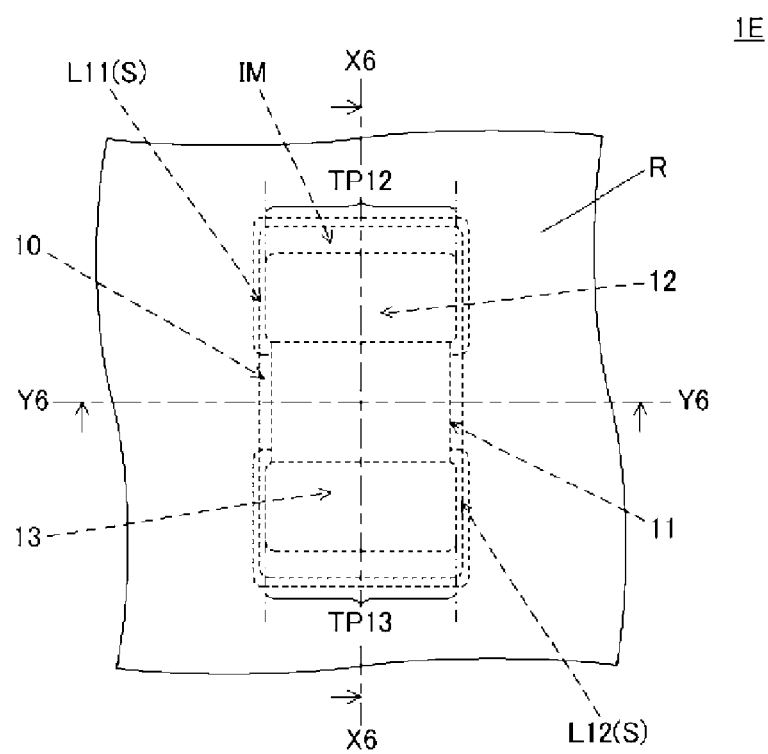
FIG. 15 is a top view of a modification of the built-in-electronic-component substrate according to the second preferred embodiment of the present invention and corresponds to FIG. 11.
Figure 16A:
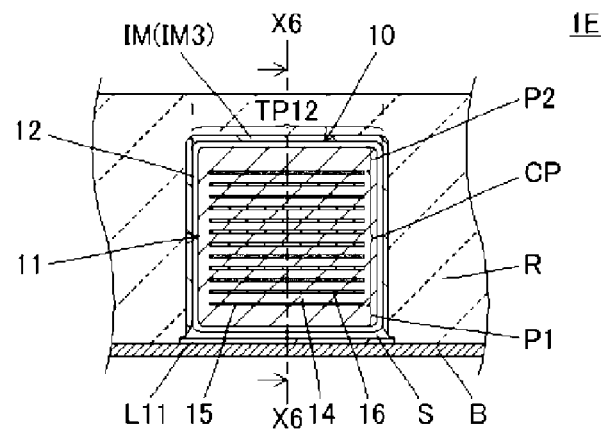
FIGS. 16A to 16C are sectional views of the modification of the built-in-electronic-component substrate according to the second preferred embodiment of the present invention and correspond to FIGS. 12A and 12B.
Figure 16B:
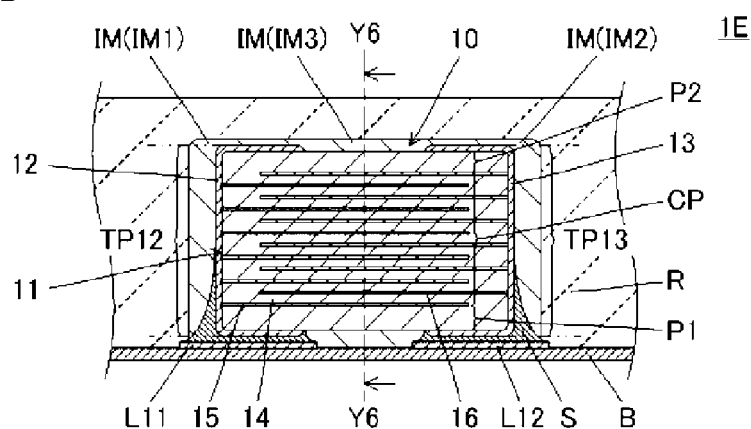

FIG. 15 is a top view of the modification 1E of the built-in-electronic-component substrate according to the second preferred embodiment of the present invention. FIG. 16A is a sectional view taken in the direction of arrows of a plane including the line Y6-Y6 in FIG. 15. FIG. 16B is a sectional view taken in the direction of arrows of a plane including the line X6-X6 in FIG. 15.

In the modification 1E of the built-in-electronic-component substrate according to the second preferred embodiment of the present invention, a third insertion member IM3 is provided in a third gap G3 between the resin layer R and a portion of the ceramic multilayer body 11 not covered by the first outer electrode 12 and the second outer electrode 13.

FIG. 16B illustrates a case in which the third insertion member IM3 is arranged so as to surround side surfaces of the ceramic multilayer body 11 in an annular manner and is connected to the first insertion member IM1 and the second insertion member IM2 to define a single integrated insertion member IM.

The modification 1E of the built-in-electronic-component substrate according to the second preferred embodiment described above is manufactured by providing the insertion members so as to surround the electronic component 10 mounted on the one main surface of the core substrate B in the step of providing the insertion members in the manufacturing method for the built-in-electronic-component substrate described above.

That is, in the modification 1E of the built-in-electronic-component substrate according to the second preferred embodiment of the present invention, even if strain is generated due to application of a voltage to the electronic component 10, the strain in the vicinities of the end surfaces of the electronic component 10 is alleviated by the first insertion member IM1, the second insertion member IM2 and the third insertion member IM3, which have a low elasticity and deform easily.

Therefore, transmission of strain from the electronic component 10 to the core substrate B via the resin layer R is further reduced or prevented, and as a result, vibration of the built-in-electronic-component substrate of the modification 1E is further reduced and generation of audible sound by the vibration is effectively significantly reduced or prevented.

In addition, by providing the first insertion member IM1 in the first gap G1, the second insertion member IM2 in the second gap G2 and the third insertion member IM3 in the third gap G3, the resin layer R in which the gaps or hollows are provided is closer to being a resin layer in which gaps are not formed. Therefore, moisture resistance and the rigidity of the built-in-electronic-component substrate of the modification 1E are improved compared to those in a case where only the first gap G1 and the second gap G2 and the third gap G3 are provided.

Figure 16C:
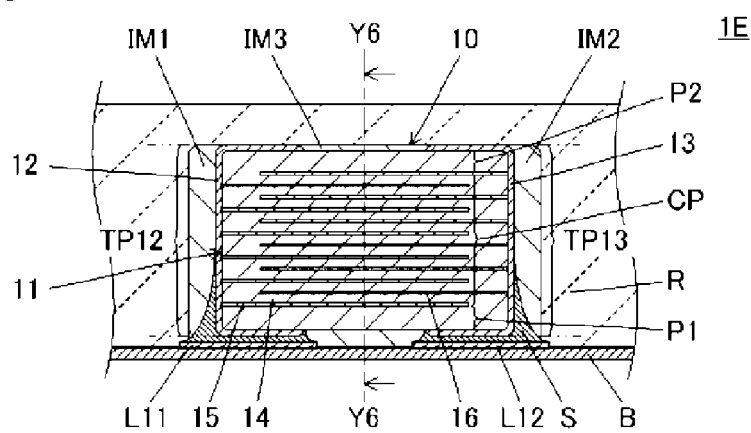

In FIG. 16B, a case is illustrated in which the first insertion member IM1, the second insertion member IM2 and the third insertion member IM3 are integrated with each other and form an insertion member IM, but as illustrated in FIG. 16C the insertion members may be formed so as to be separate from each other. In this case, since the insertion members over side surface portions of the first outer electrode 12 and the second outer electrode 13 are eliminated, the profile of the built-in-electronic-component substrate of the modification 1E is significantly reduced.

The present invention is not limited to the above-described preferred embodiments and various applications and modifications can be added within the scope of the present invention.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A built-in-electronic-component substrate comprising:
a core substrate;
at least one electronic component mounted on one main surface of the core substrate via a joining member; and
a resin layer provided on the one main surface of the core substrate such that the at least one electronic component is embedded in the resin layer; wherein
the at least one electronic component is a multilayer capacitor including:
a multilayer body including an electrostatic capacitance exhibiting portion in which capacitor elements, in each of which a dielectric layer is interposed between a first inner electrode and a second inner electrode, are stacked, and a first protective portion and a second protective portion sandwiching therebetween the electrostatic capacitance exhibiting portion, and including two opposing end surfaces parallel or substantially parallel to a stacking direction of the capacitor elements and including side surfaces connecting the two end surfaces; and
a first outer electrode and a second outer electrode including end surface portions provided on the end surfaces of the multilayer body and respectively connected to the first inner electrodes and the second inner electrodes at the end surface portions; and
a first gap is provided between the resin layer and the end surface portion of the first outer electrode and the joining member on the end surface portion thereof;
a second gap is provided between the resin layer and the end surface portion of the second outer electrode and the joining member on the end surface portion thereof; and
a first insertion member having a lower elasticity than the resin layer is provided in the first gap and a second insertion member having a lower elasticity than the resin layer is provided in the second gap.

2. The built-in-electronic-component substrate according to claim 1, wherein a third gap is provided between the resin layer and a portion of the multilayer body not covered by the first outer electrode and the second outer electrode.

3. A built-in-electronic-component substrate comprising:
a core substrate;
at least one electronic component mounted on one main surface of the core substrate via a joining member; and
a resin layer provided on the one main surface of the core substrate such that the at least one electronic component is embedded in the resin layer; wherein
the at least one electronic component is a multilayer capacitor including:
a multilayer body including an electrostatic capacitance exhibiting portion in which capacitor elements, in each of which a dielectric layer is interposed between a first inner electrode and a second inner electrode, are stacked, and a first protective portion and a second protective portion sandwiching therebetween the electrostatic capacitance exhibiting portion, and including two opposing end surfaces parallel or substantially parallel to a stacking direction of the capacitor elements and including side surfaces connecting the two end surfaces; and
a first outer electrode and a second outer electrode including end surface portions provided on the end surfaces of the multilayer body and respectively connected to the first inner electrodes and the second inner electrodes at the end surface portions; and
a first gap is provided between the resin layer and the end surface portion of the first outer electrode and the joining member on the end surface portion thereof;
a second gap is provided between the resin layer and the end surface portion of the second outer electrode and the joining member on the end surface portion thereof;
a third gap is provided between the resin layer and a portion of the multilayer body not covered by the first outer electrode and the second outer electrode; and
a third insertion member having a lower elasticity than the resin layer is provided in the third gap.

4. The built-in-electronic-component substrate according to claim 1, wherein the first gap and the second gap have a same shape as each other.

5. The built-in-electronic-component substrate according to claim 1, wherein the first gap and the second gap have non-symmetrical shapes.

6. The built-in-electronic-component substrate according to claim 1, wherein the first protective portion and the second protective portion have a same thickness or substantially a same thickness.

7. The built-in-electronic-component substrate according to claim 1, wherein a thickness of the first protective portion is larger than a thickness of the second protective portion.

8. The built-in-electronic-component substrate according to claim 2, wherein the third gap surrounds side surfaces of the ceramic multilayer body in an annular manner.

9. The built-in-electronic-component substrate according to claim 2, wherein the third gap is connected to the first gap and the second gap to define a single integrated gap.

10. The built-in-electronic-component substrate according to claim 1, wherein the at least one electronic component includes a first electrode terminal attached to the first outer electrode by the joining member and a second electrode terminal attached to the second outer electrode by the joining member.

11. The built-in-electronic-component substrate according to claim 1, further comprising an interposer including one main surface and another main surface that are substantially parallel or substantially parallel to each other, a first intermediary land and a second intermediary land provided on a first main surface and a third intermediary land and a fourth intermediary land are provided on a second main surface.

12. The built-in-electronic-component substrate according to claim 11, wherein the first intermediary land and the second intermediary land of the interposer are respectively connected to the first outer electrode and the second outer electrode by the joining member.

13. The built-in-electronic-component substrate according to claim 11, wherein the third intermediary land and the fourth intermediary land are respectively connected to a first mounting land and a second mounting land.

* * * * *